(12) United States Patent
Lahr et al.

(10) Patent No.: US 9,059,724 B2
(45) Date of Patent: Jun. 16, 2015

(54) DIFFERENTIAL DECODER

(71) Applicant: Analog Devices, Inc., Norwood, MA (US)

(72) Inventors: Lewis F. Lahr, Dover, MA (US); William J. Thomas, Foxborough, MA (US); William Hooper, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/191,556

(22) Filed: Feb. 27, 2014

(65) Prior Publication Data

US 2015/0009050 A1  Jan. 8, 2015

Related U.S. Application Data

(60) Provisional application No. 61/843,902, filed on Jul. 8, 2013.

(51) Int. Cl.
*H03M 7/30* (2006.01)
*H03M 5/12* (2006.01)

(52) U.S. Cl.
CPC ........................................ *H03M 5/12* (2013.01)

(58) Field of Classification Search
CPC ......... H03M 5/12; H03M 5/145; H03M 5/08; H03M 7/00; H03M 3/462; H03M 5/04; H03M 5/06; H03M 5/14; H03M 5/18; H03M 5/20; H03M 7/20; H04L 25/4904; H04L 7/0066; H04L 27/02; H04L 7/0331; H04L 7/0337; H04L 12/422; H04L 25/03878; H04L 25/61; H04L 27/06; H04L 5/143; H04L 5/16; H04L 7/0041; H04L 7/02; H04L 7/046
USPC ............... 375/359, 361, 364, 220; 341/69–72
See application file for complete search history.

(56) References Cited

U.S. PATENT DOCUMENTS

| | | | |
|---|---|---|---|
| 4,317,211 A * | 2/1982 | Quesnell, Jr. ................. | 375/333 |
| 4,542,420 A | 9/1985 | Kozlik et al. | |
| 4,675,884 A | 6/1987 | Nakamura et al. | |
| 5,056,114 A | 10/1991 | Wight | |
| 5,168,511 A * | 12/1992 | Boles ............................ | 375/328 |
| 5,446,765 A | 8/1995 | Leger | |
| 5,696,800 A * | 12/1997 | Berger ......................... | 375/361 |
| 5,805,632 A * | 9/1998 | Leger ............................ | 375/282 |
| 6,008,746 A * | 12/1999 | White ............................. | 341/70 |
| 6,285,722 B1 * | 9/2001 | Banwell et al. ............... | 375/354 |
| 6,298,104 B1 * | 10/2001 | Saeki ............................ | 375/364 |
| 6,370,212 B1 * | 4/2002 | Nakai ............................ | 375/359 |
| 6,628,212 B1 * | 9/2003 | Toutant .......................... | 341/70 |
| 6,987,824 B1 * | 1/2006 | Boerstler ...................... | 375/359 |
| 7,487,331 B2 | 2/2009 | Thomsen | |
| 7,835,462 B2 | 11/2010 | Oishi | |
| 8,384,568 B2 * | 2/2013 | Govindammagari et al. .. | 341/70 |
| 8,416,903 B1 * | 4/2013 | Oh et al. ....................... | 375/355 |

* cited by examiner

*Primary Examiner* — Linh Nguyen

(57) ABSTRACT

In an example embodiment, a signal processor is disclosed that is configured to decode a clock-first, change-on-zero differential Manchester encoded data stream. The data stream has no local clock, and both combinatorial and sequential logic is used to decode the stream into a clocked data signal and an optional error signal. Decoding comprises a parser that separates the input data stream into an intermediate data signal, an intermediate clock signal, and a conditioning signal. A data and error generator receives the three signals and outputs a clocked data signal and a clocked error signal.

22 Claims, 6 Drawing Sheets

DIFFERENTIAL DECODER

CROSS-REFERENCE TO RELATED APPLICATIONS

This application claims priority to U.S. Provisional Application 61/843,902, titled "Differential Decoder," filed 8 Jul. 2013, which is incorporated by reference in its entirety.

FIELD OF THE DISCLOSURE

This application relates to the field of digital signal processing, and more particularly to a differential Manchester decoder.

BACKGROUND

Differential Manchester encoding, described in the IEEE 802.5 standard (originally intended for token ring networks), is a form of digital communication in which data and clock signals are combined into a single asynchronous data stream. In the differential Manchester stream, there are either one or two transitions for each data bit. In an example differential Manchester stream, the first transition carries the clock signal, and the optional second transition carries a datum. The optional second transition can mean either a "1" or a "0," depending on the design parameters, while a lack of a second transition encodes the opposite value. This is known as a "clock-before-data" configuration. Alternative "data-before-clock" configurations are also in existence. One common objective in such configurations is to minimize noise and to reduce the average transmitting power, for example, by using a "high" and "low" value that have the same magnitude and opposite polarity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE EMBODIMENTS

Overview

Figure 1:
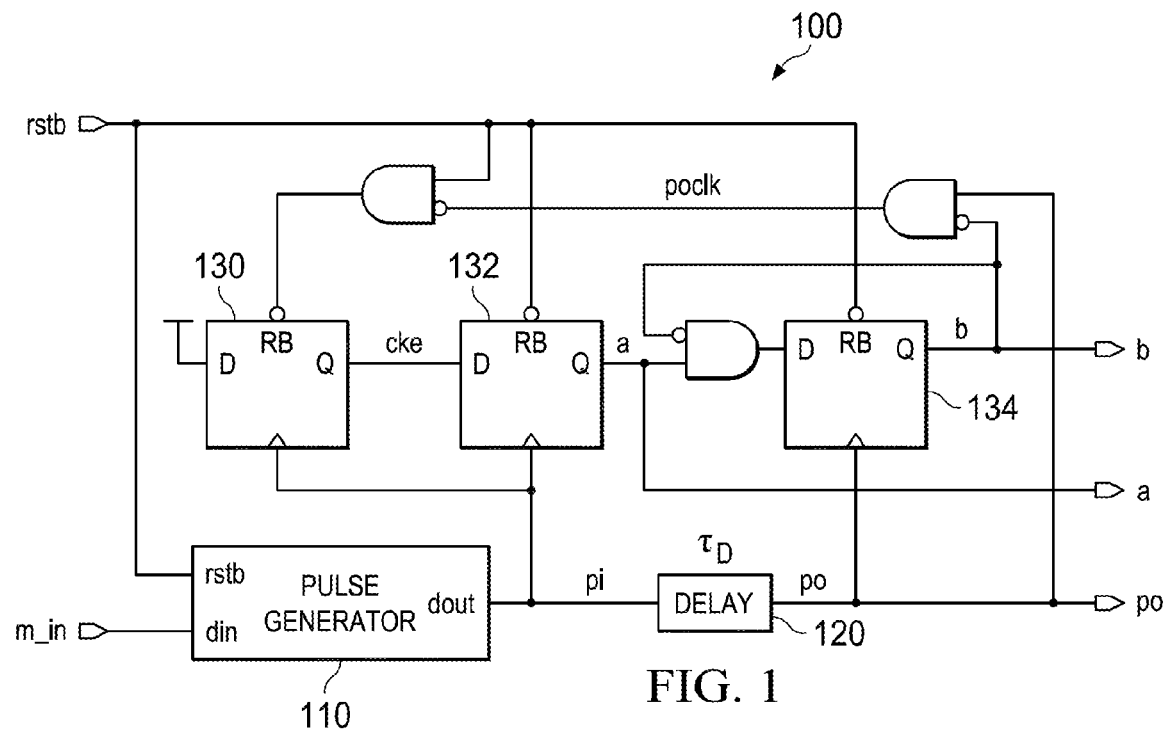
FIG. 1 is a block diagram of a parsing circuit in accordance with an example embodiment of the present disclosure.

In one example embodiment, there is disclosed a decoder circuit for decoding a composite clock-data signal $m_{in}$ into a data signal data without the use of a local clock, comprising a parsing circuit configured to parse $m_{in}$ into an intermediate data signal a, a conditioning signal b, and an intermediate clock signal $p_o$; and a data circuit comprising: a logic subnetwork configured to receive a, b, and $p_o$ and to generate therefrom a clock signal sclk; and a data subnetwork clocked by sclk and configured to generate data from a.

In another example embodiment, there is disclosed a method of decoding a composite clock-data signal $m_{in}$ into a data signal data without the use of a local clock, comprising: parsing the clock signal into an intermediate data signal a, a conditioning signal b, and an intermediate clock signal $p_o$; generating from a, b, and $p_o$ a clock signal sclk; generating data from a, wherein data is clocked by sclk.

There is disclosed in yet another embodiment a signal processor configured to decode a clock-before-data, change-on-zero differential Manchester-encoded signal $m_{in}$, comprising: a network interface for receiving $m_{in}$; a parser configured to infer from $m_{in}$ a first inferred signal, a second inferred signal, and a third inferred signal; and a data encoder configured to infer and output a data signal inferred from the first inferred signal, wherein the output signal is clocked by a clock signal inferred from the first, second, and third inferred signals.

EXAMPLE EMBODIMENTS OF THE DISCLOSURE

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiment many have different advantages, and no particular advantage is necessarily required of any embodiment.

In an example embodiment, a decoder circuit is disclosed for use in a signal processor that may operate on, for example, audio signals. In this example, the input signal is a differential Manchester encoding, in a clock-before-data, change-on-zero configuration. In other words, in the example embodiment, each data period begins with a transition representing the clock pulse, and thereafter may include an optional transition representing a datum of "0." The decoder circuit is configured to provide a decoded data stream from a differential Manchester-encoded input without requiring a local clock. Rather, a clock signal is parsed from the input data stream itself. This capability may be useful, for example, in an application where a synchronization signal taken from an encoded data stream is used to clock a phase lock loop to generate a local node clock.

In the example embodiment, the signal processor comprises two main circuits, a parser and a data and error generator. The example parser receives a differential Manchester encoded signal as its input, and parses the input signal into three output signals, referred to as intermediate data signal a, intermediate clock signal $p_o$, and conditioning signal b for ease of reference. In other embodiments, these signals may be referred to more generically as a first, second, and third inferred signal. The example data and error generator receives a, b, and $p_o$, and infers a clock signal sclk from a combinatorial logic function of all three. This is used to clock a sequential data output data and a sequential error output error.

In one example of a parser, the differential Manchester input drives a pulse generator, which is used to create short clocking pulses $p_i$ that may be just long enough to drive a plurality of sequential logic devices referred to herein as triggers for ease of reference. Signal $p_i$ clocks a first trigger configured to output a "1" on each clock edge, indicating that a clock edge occurred at the beginning of the period as expected. This signal is called cke in the example embodiment. A delayed version of $p_i$ called $p_o$ is then used to clock a second trigger that looks for the presence of a data edge, outputting a "1" when there is a data edge, and a "0" when there is not. A third trigger receives combinatorial inputs and outputs conditioning signal b, which is used in recovery of sclk and for error detection. Specifically, the logic for b is designed so that a and b are both high upon a pulse of $p_o$ only when a clock edge has not occurred at the beginning of a period.

The data and error generator receives a, b, and $p_o$ as inputs. As described above, combinatorial logic is used to recover sclk, and sclk is used as to clock two triggers. The first trigger receives ~a as its input, so that the inverse of a is clocked out on each pulse of sclk. This signal is called data, and is then usable as a sequential data signal. The second trigger receives a combinatorial logic function as its input, and outputs a signal error if a and b are both high upon a clock pulse, indicating that an expected clock edge has not occurred.

Figure 7:
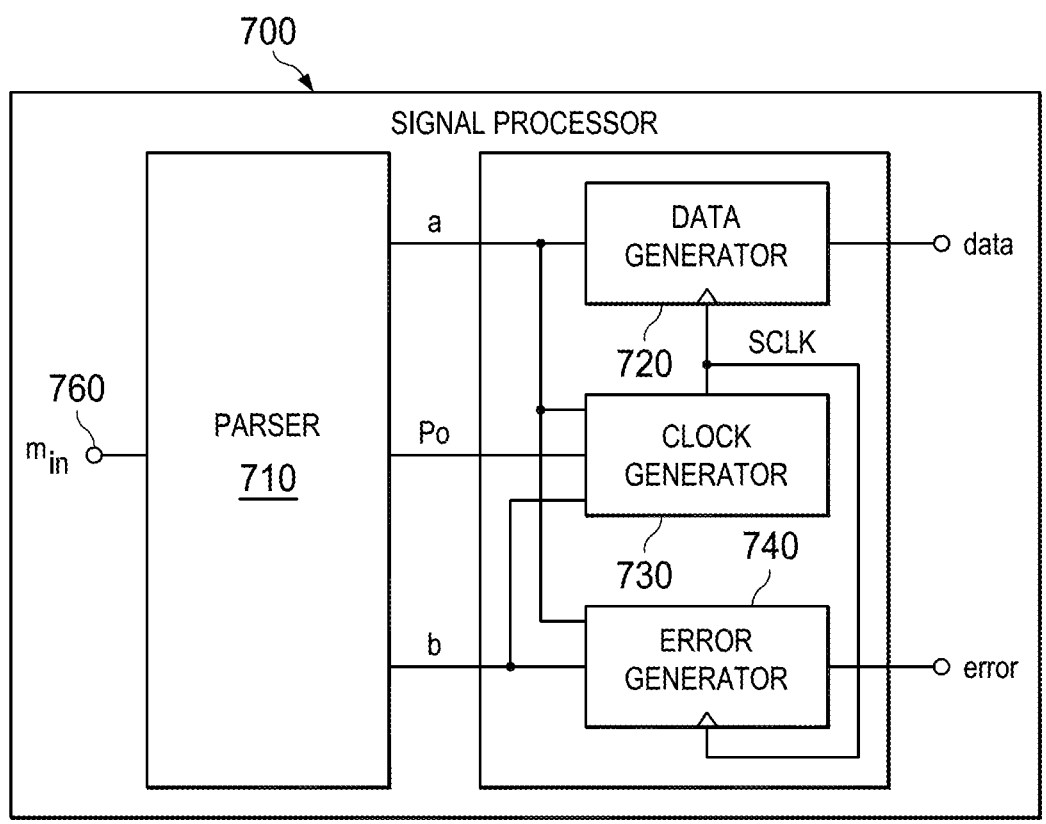
FIG. 7 is a block diagram of a signal processor in accordance with an example embodiment of the present disclosure.

Turning briefly to the FIGURES for illustration purposes, FIG. 7 is a block diagram of an example signal processor in accordance with the present disclosure. Signal processor 700 includes a parser 710 and data and error generator 750. Data and error generator 750 includes a data generator 720, clock generator 730, and error generator 740. It should be understood that the labels provided for the various elements disclosed herein are for ease of reference only, and it is not intended that the labels limit the function of the elements disclosed. In a more general sense, parser 710 and data and error generator 750 are subnetworks of signal processor 700. Data generator 720, clock generator 730, and error generator 740 are subnetworks of data and error generator 750. It should also be noted that the divisions shown are logical blocks only, intended to disclose the functional relationship between the various elements, and that in some embodiments, one or more functions may be provided by a common hardware element, or certain hardware elements may be shared between different logical blocks. In other embodiments, certain elements may be carried out by a programmable processor programmed with suitable software instructions.

In an example, parser 710 is configured to receive a signal $m_{in}$ over network interface 760. Signal $m_{in}$ is a composite clock-and-data signal, having embedded therein a clock portion and a data portion, and may be a differential Manchester-encoded signal, and in particular may be of the clock-before-data, change-on-zero variety of differential Manchester encoding. Network interface 760 is communicatively coupled to parser 710, and provides $m_{in}$ to parser 710. Parser 710 may be a parsing network configured to extract from $m_{in}$ a first, second, and third inferred signal, which are referred to as a, b, and $p_o$ for ease of reference. In this example, a is referred to as an intermediate data signal, b is referred to as a conditioning signal, and $p_o$ is referred to as an intermediate clock signal. Signal a may carry the information needed to reconstruct a clocked, binary data signal, b may contain information useful in error conditioning, and a, b, and $p_o$ together may be used to reconstruct a clock signal sclk used to clock data.

Data and error generator 750 receives b, and $p_o$ as inputs. In an example, data generator 720 receives a, clock generator 730 receives a, b, and $p_o$, and error generator 740 receives a and b. Clock generator generates sclk, which is used to clock data generator 720 and error generator 740. Thus, output signals data and error are clocked binary signals.

FIG. 1 is a block diagram of a differential decoder 100 according to one or more examples of the present specification, disclosing with more particularity the function of parser 710 in an example embodiment. Parser 710 receives input signals $m_{in}$ and rstb. Signal rstb may be designed to reset conditioning signal b, and also is used as a reset signal for triggers 130, 132, and 134, which in an example are D ("data") flip-flops. Pulse generator 110 and delay element 120 are also included in differential decoder 100.

Figure 4:
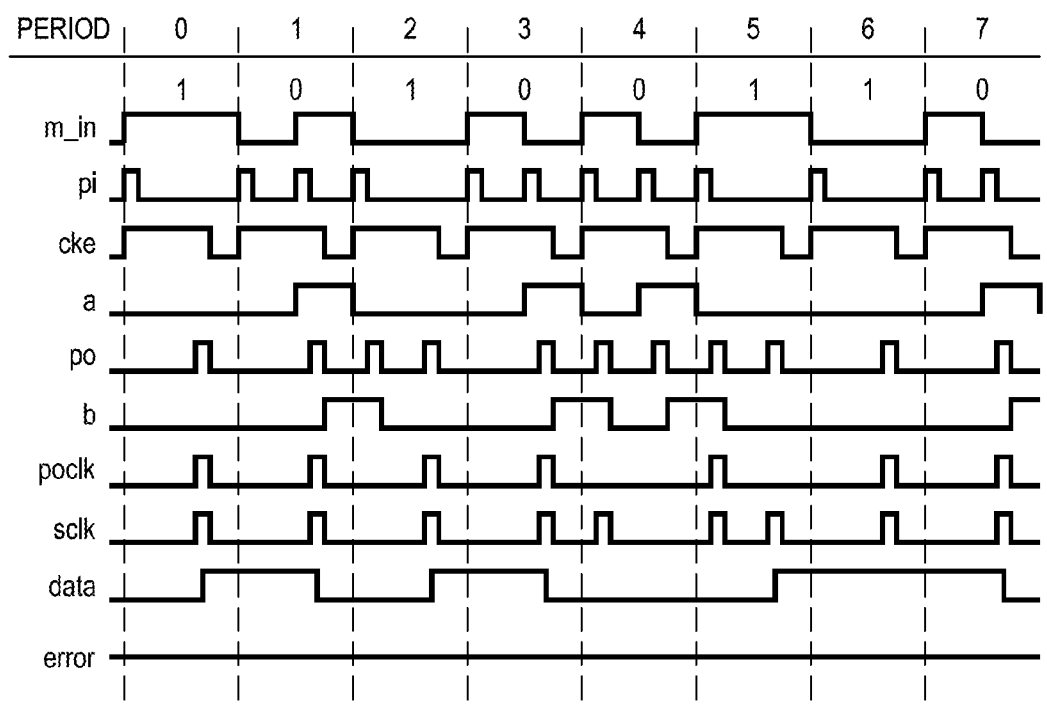
FIG. 4 is a timing diagram in accordance with an example embodiment of the present disclosure.

In the example embodiment, pulse generator receives $m_{in}$ and is configured to provide an output pulse $p_i$ on each transition edge of $m_{in}$, as is more readily visible in the timing diagram of FIG. 4, in which the signals herein are divided into eight periods numbered 0-7, wherein each period has a length of $t_{per}$. At the beginning of period 0, a rising edge of $m_{in}$ creates a pulse, $p_i$, which represents the clock pulse for period 1. As is visible in FIG. 4, periods 0, 2, 5, and 6 have only one pulse at the beginning of the period. Because the present example is a change-on-zero embodiment of the differential Manchester encoding scheme, a second pulse in each period is optional, and will occur only when the encoded datum is a "0." Thus, periods 0, 2, 5, and 6 have only one pulse, because they encode a "1." Periods 1, 3, 4, and 7 have the optional second pulse in each period, indicating that the datum for each of these periods is a "0." In the example embodiment, pulse generator 110 is configured to output a relatively narrow $p_i$ for a time selected to be long enough to clock triggers 130, 132, and 133, but otherwise to be as short as practical.

Delay element 120 receives $p_i$ and delays the signal for a time $t_d$, wherein $t_d$ is selected to be related to the period $t_{per}$. After $t_d$, delay element 120 outputs delayed pulse $p_o$, which is an output of parser 710. In an example, $t_d$ is selected to be after the following data edge, but before the following clock edge. The value of $t_d$ may be selected to be, for example, approximately 70% of $t_{per}$, and the pulse width of $p_o$ may be substantially the pulse width of $p_i$.

Trigger 130 is a D flip-flop in the example embodiment, and is clocked by $p_i$. The data input of trigger 130 may be tied to a supply voltage at a logical "1" level, so that the output signal cke will remain "1" until a reset signal is received at the RB terminal of trigger 130. The purpose of cke is to indicate that a clock edge has occurred in $m_{in}$, and comes after a data edge, if any. Signal cke is reset by a modified version of $p_o$ called $p_o$clock, which is the combinatorial logic value $p_o$clock=($p_o$ &~b) (the logical AND of $p_o$ and the inverse of conditioning signal b). The RB input of trigger 130 is, in turn, the combinatorial logic value of ($p_o$clock &rstb) (the logical AND of the inverse of $p_o$clock and the reset signal rstb. The shape of signal cke can be seen in FIG. 4, where it is seen to be set by the transition occurring at the beginning of each period, and cleared by the rising edge of $p_o$ whenever b is also low.

Trigger 132 is also a D flip-flop in the example embodiment, and receives cke as its data input. It is clocked by $p_i$, and output intermediate data signal a as its output. The RB node of trigger 132 is tied directly to rstb. By design, a is low during any period of $m_{in}$ that encodes a "1." For any period that encodes a "0," a is high for the portion of the period occurring after the transition, as seen in periods 1, 3, 4, and 7 of FIG. 4. Thus, intermediate data signal a encodes an unclocked version of the final output signal data, but a useful clock signal is needed to recover the data.

Trigger 134 is also a D flip-flop in the example embodiment, and receives as its data input the combinatorial logic value of (a & ~b) (where b is received in a feedback configuration). Its RB terminal is tied directly to rstb, and it is clocked by $p_o$. Its output value is conditioning signal b, which is used both to recover the clock signal for data and to check for errors in data. $p_o$ edges that occur while b is a logic 1 are data edges (in other words, (~b & $p_o$)=sclk. If a and b are both sampled as 1 by $p_o$clock, a Manchester clock edge is missing and a Manchester decode error has occurred.

In one example embodiment, the final outputs of parser 710 as disclosed in FIG. 1 are intermediate data signal a, conditioning signal b, and intermediate clock signal $p_o$.

Figure 2:
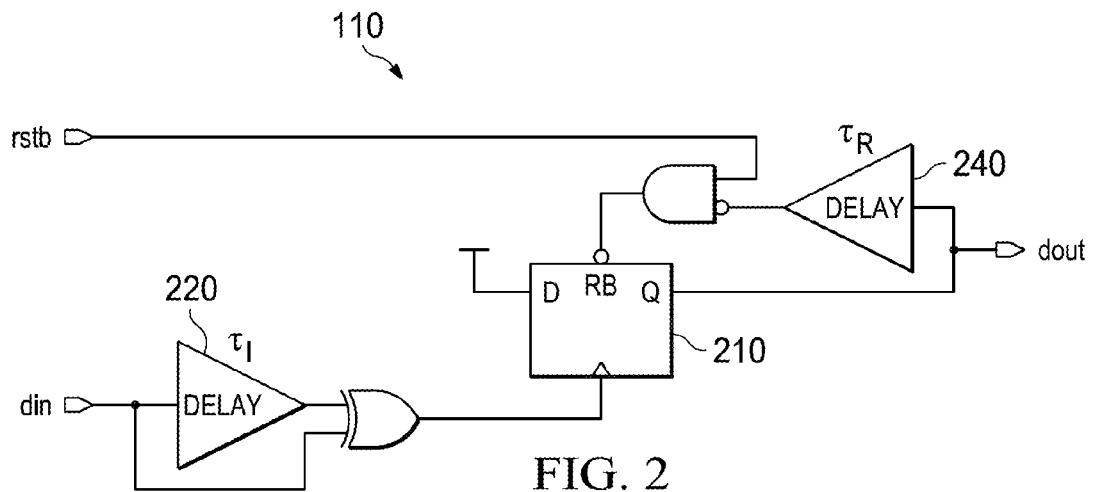
FIG. 2 is an example of a pulse generator in accordance with an example embodiment of the present disclosure.

FIG. 2 is a block diagram of an example embodiment of pulse generator 110. Pulse generator 110 receives as inputs a data input signal $d_{in}$, which in an example embodiment may be configured to receive $m_{in}$. Input signal $d_{in}$ feeds a discrete delay element 220, which provides a delay of $T_1$, which is configured to be long enough to robustly clock a trigger. An exclusive or (XOR) gate 230 receives as inputs $d_{in}$ and $d_{\tau 1}$, which provides an output pulse only when $d_{in}$ matches $d_{\tau 1}$. This pulse is used to clock a trigger 210, which in the example is a D flip-flop (i.e., clk=$d_{in}$^$d_{\tau 1}$). This is equal to "1" for the duration of the delay. $\tau_1$ is configured to create a pulse wide enough for trigger 210 to be functional. The input of trigger 210 is tied directly to a supply or logical "1" voltage. The output of trigger 210 is $d_{out}$, which in this embodiment may be signal $p_i$. Signal $d_{out}$ is also fed back through a delay element 240, with a delay of $\tau_R$, which is selected to be the desired pulse width of $d_{out}$. After time $T_R$, $d_{out}$ is inverted and fed back to the RB terminal of trigger 210, thus resetting $d_{out}$ one pulse width after each rising edge of $d_{out}$. The signal rstb may also be used to reset $d_{out}$.

Figure 3:
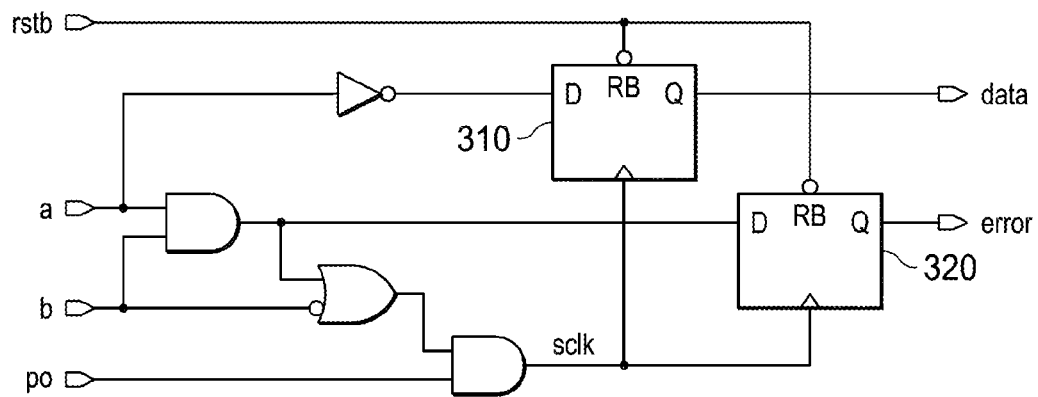
FIG. 3 is an example of a data and error generator in accordance with an example embodiment of the present disclosure.

FIG. 3 is a block diagram of data and error generator 750. As described in connection with FIG. 7, data and error generator 750 comprises data generator 720, clock generator 730, and error generator 740. Clock generator 730 includes only combinatorial logic in this example embodiment. Absent errors, sclk=($p_o$&~b). When an error occurs, an extra pulse of sclk occurs, and the Manchester data edge and Manchester clock edge switch, or in other words sclk=$p_o$&(a&b). The full logic is therefore sclk=$p_o$&((a&b)|~b) The signal sclk is used to clock both data generator 720 and error generator 740, as can be seen on FIG. 4.

Data generator 720 comprises a trigger 310, which in the example embodiment is a D flip-flop. The RB pin of trigger 310 is tied to rstb. The data input to trigger 310 is the inverse of intermediate data signal a. The inverse is used because the example embodiment uses a change-on-zero differential Manchester encoding. Thus, a goes high whenever a data transition occurs indicating a "0," and stays low when a transition does not occur, indicating a "1." Trigger 310 is clocked by sclk, and its output value is the clocked data signal data. Signal data can also be seen on FIG. 4, where it can be seen that data transitions high upon sclk in period 0, transitions low upon sclk in period 1, transitions high again in period 2, transitions low in period 3, stays low in period 4, transitions high in period 5, stays high in period 6, and transitions low in period 7, all consistent with the data for each period. In this example, data is clocked purely by sclk, but in other examples, an external clock may be used, which may require the use of clock domain crossing techniques.

Figure 5:
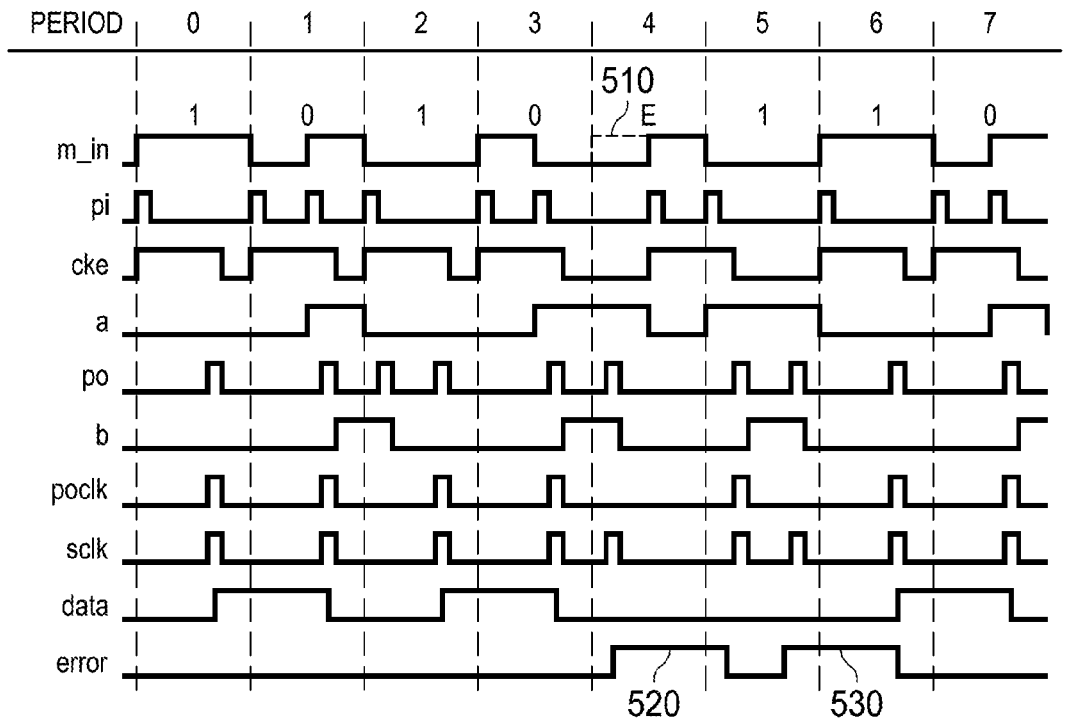
FIG. 5 is a timing diagram in accordance with an example embodiment of the present disclosure.

Error generator 740 comprises trigger 320, which in the example embodiment is a D flip-flop. Like trigger 310, trigger 320 is clocked by sclk, and the RB pin is tied to rstb. The data input for trigger 320 is provided by combinatorial logic of (a & b). In other words, error goes high on any clock cycle of sclk when both a and b are true. This may occur, for example, when an expected clock edge does not occur, as can be seen in FIG. 5. Pulse 510 is an expected clock edge at the beginning of period 4 that does not occur. Because there is no transition at the beginning of period 4, both a and b are high when the sclk pulse for period 4 occurs. Thus, error pulse 520 is generated. Because no clock edge occurred for period 4, the transition within period 4 is then taken as the clock edge. The transition at the beginning of period 5 is then taken as a data edge, so that data is incorrectly encoded as a "0" for this period. Thus, a clock edge is erroneously expected during period 5. When it does not occur, error pulse 530 is generated. However, the signal becomes resynchronized during period 6, when data correctly transitions high. At this point, error is cleared.

Figure 6:
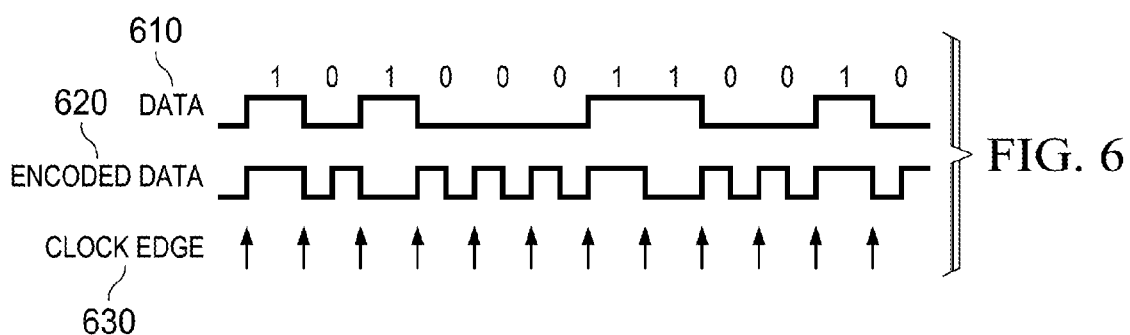
FIG. 6 is a timing diagram in accordance with an example embodiment of the present disclosure.

FIG. 6 is a timing diagram illustrating encoding of data according to one or more example embodiments of the present Specification. In this example timing diagram, serial data stream 610 is traditionally encoded by a series of regular clock edges. Serial data stream 620 illustrates the same data encoded in a Manchester stream of the present disclosure.

Figure 8:
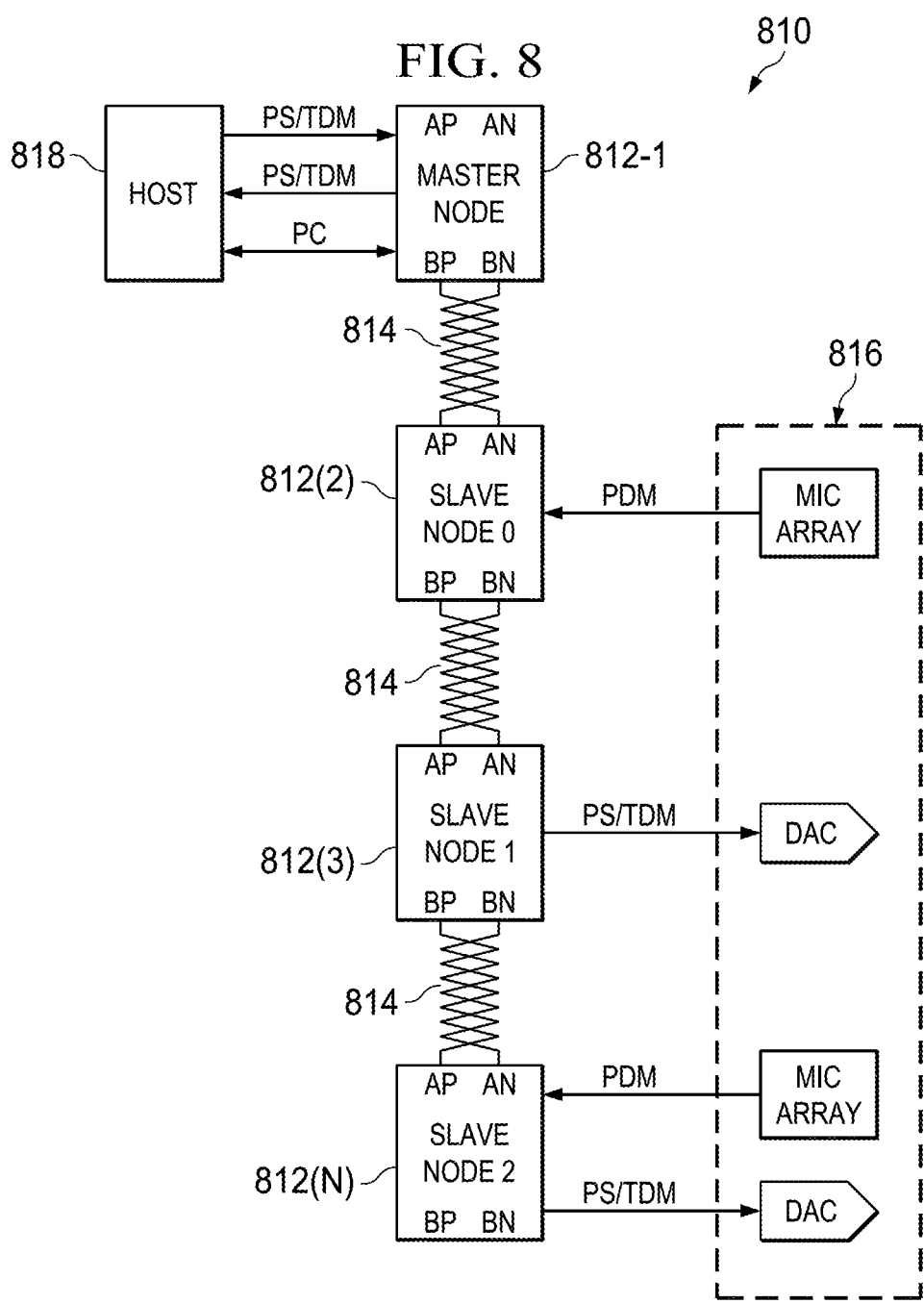
FIG. 8 is a simplified block diagram illustrating a system 10 including a two-wire communication protocol engine according to one or more example embodiments of the present Specification.
Figure 9:
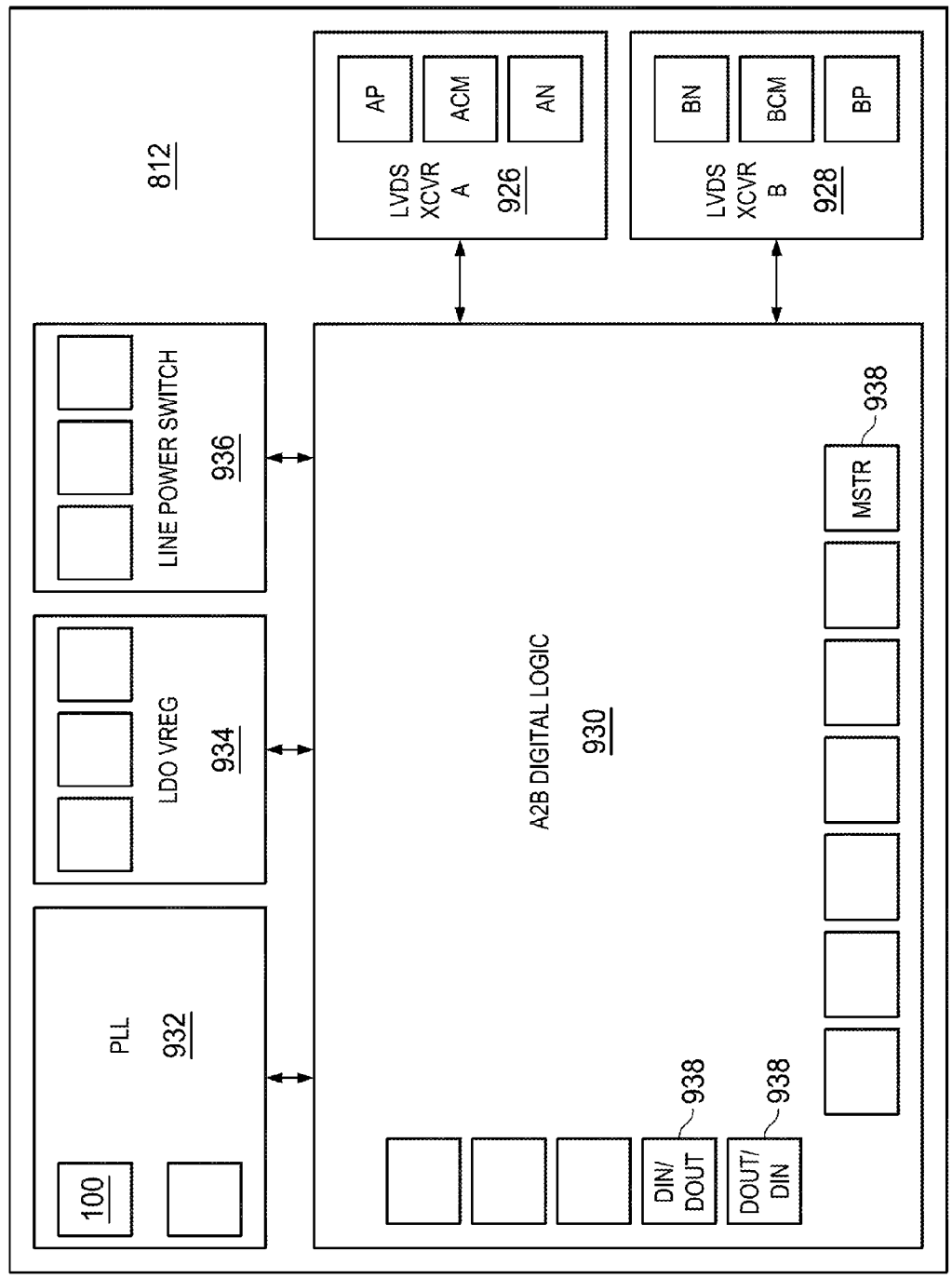
FIG. 9 is a simplified block diagram illustrating an example node according to one or more example embodiments of the present Specification

FIGS. 8-9 disclose an example embodiment of a differential decoder in situ with a two-wire communication protocol engine. FIG. 8 is a simplified block diagram illustrating a system 810 including a two-wire communication protocol engine according to one or more example embodiments of the present Specification. System 810 comprises a plurality of nodes 812-1-812-N. 812-1 represents a master node, which communicates with three slave nodes 812-2-812-N over a twisted wire pair bus 814 using a two-wire communication protocol (e.g., $A^2B$ protocol). Each slave node 812-1-812-N may read and/or write data from/to one or more sensors or other peripheral devices 816. Examples of peripheral devices include microphones (mics), mic arrays, digital to analog converters (DACs), etc. A host controller 818 may communicate with and control master node 812-1 over multi-channel $I^2S$ and Inter-Integrated Circuit ($I^2C$) communication protocols. Embodiments of the $A^2B$ protocol engine may allow for control information and audio data to be transmitted in both directions using twisted wire pair bus 814 to connect each node to the next one. Slave nodes 812-2-812-N can also be powered by twisted wire pairs 814.

As used herein, the term "node" refers to an integrated circuit, device or other such object capable of sending and receiving data (e.g., electrical signals) over appropriate communications channels in an electrical circuit. The "master node" comprises an originator of a clock signal (e.g., which can be derived from an $I^2S$ input), downstream data, network control and power; the master node is programmed by host controller 818 (e.g., microprocessor), and it receives/sends payload to/from host controller 818. The "slave node" comprises an addressable network connection point that can represent a possible destination for downstream data frames (e.g., single block of payload of a specific node with possibly multiple synchronous data slots of content) and source of upstream data frames. Synchronous data refers to continuously streamed data (e.g., audio signal) in which a fixed time interval (e.g., 48 kHz) and a fixed phase spaces two corresponding transitions.

In various embodiments, each node 812-812-N may include an A²B protocol engine implemented, for example, in a portion of an integrated circuit. In various embodiments, the A²B protocol engine manages control and data transmissions in the linear, bi-directional, multi-node bus system. According to various embodiments, the integrated circuit comprising the A²B protocol engine can work well in a noisy environment, for example, by minimizing electromagnetic emissions. Each protocol engine may include a state machine that allows for synchronized updates of programmed data across system 810, a distributed interrupt system, a synchronization pattern based on data coding used in the two-wire communication protocol, and data scrambling applied to a portion of the data traversing twisted wire pair bus 814. Another feature includes a simplified floating-point compression to compress data before it is transmitted across twisted wire pair bus 814.

In a general sense, the A²B protocol can connect multichannel I²S synchronous, pulse code modulated (PCM) data between nodes 812-1-812-N. The A²B protocol can also extend the synchronous, time division multiplexed (TDM) nature of I²S to system 10 that connects multiple nodes 812-1-812-N, where each node 812-1-812-N can consume data, provide data, or both.

According to various embodiments, master node 12-1 may be configured (e.g., programmed, designed, etc.) through an integrated I²C port. Master node 812-1 may generate downstream A²B transactions (e.g., data signals, power signals, etc.) and receive upstream A²B transactions. Data received via twisted wire pair 814 may be written into an A²B frame buffer and transmitted out of master node 812-1 through two I²S transmitters. Data to be transmitted via A²B may be read from the A²B frame buffer, which may be filled by two I²S receivers. In some embodiments, master node 812-1 comprises state machines to manage the A²B protocol including discovery (e.g., of slave nodes 812-2-812-N), broadcast writes (e.g., of system wide information, configuration changes, etc.), CRC generation of synchronization control frames, cyclic redundancy check (CRC) error detection and handling for synchronization response frames, CRC error detection and handling for interrupt frames, parity generation for downstream data, and parity checks and error handling for upstream data (among other features).

Each slave node 812-2-812-N may be configured through the upstream A²B port. Each slave node 812-2-812-N may receive downstream A²B transactions and optionally retransmit the transactions further downstream. Each slave node 812-2-812-N may either receive or generate upstream A²B transactions, optionally retransmit data upstream, and optionally add data to the upstream transaction. Data received via A²B may be written into the A²B frame buffer and transmitted out through two I²S transmitters. Data to be transmitted via A²B may be read from the A²B frame buffer, which may be filled by two I²S receivers and/or by a PDM interface. Each slave node 812-2-812-N may comprise corresponding state machines to manage A²B protocol, similar to the state machine on master node 812-1. The I²C Interface of each slave node 812-2-812-N may be used as a master to control attached nodes. Commands may be sent from host controller 818 over twisted wire pair bus 814 and passed to a slave node through the I²C Interface. The A²B protocol can comprise a single-master, multiple-slave system where master node 812-1 is controlled by host controller 818. Host controller 818 can generate a periodic synchronization signal on its I²S TDM interface at a fixed frequency (e.g., 48 kHz) to which all A²B nodes 812-1-812-N may synchronize.

During operation, when system 810 is communicating data between various nodes 812-2-812-N, each node may be configured to handle data on twisted wire pair bus 814. Communications along A²B twisted wire pair bus 14 occurs in periodic superframes. Each superframe is divided into periods of downstream transmission (also called downstream portions), upstream transmission (also called upstream portions), and no transmission (where the bus is not driven). For example, master node 812-1 may be programmed with a number of downstream portions to transmit to slave nodes 812-2-812-N, and a number of upstream portions to receive from slave nodes 812-2-812-N. Slave nodes 812-2-812-N may be programmed with a number of downstream portions to retransmit down A²B twisted wire pair bus 814, a number of downstream portions to consume, a number of upstream portions to retransmit up A²B twisted wire pair bus 814, and a number of upstream portions to transmit received data from corresponding peripheral devices 16.

It may be noted that although only four nodes 812-1-812-N are shown herein for sake of simplicity, any number of nodes may be interconnected in a similar manner within the broad scope of the embodiments of system 10. Moreover, each slave node 812-2-812-N may communicate with any number of peripheral devices within the broad scope of the embodiments.

FIG. 9 is a simplified block diagram illustrating an example node 812 according to one or more example embodiments of the present Specification. Node 812 can include two Low Voltage Differential Signaling (LVDS) transceivers (XCVRs), namely, LVDS XCVR 926 and LVDS XCVR 928. Each LVDS transceiver 926 and 928 has a positive pad (P) and a negative pad (N). The positive pad (e.g., AP) of one transceiver on one node connects to another positive pad (e.g., BP) on another transceiver on another node. Likewise, the negative pad (e.g., AN) of one transceiver on one node connects to another negative pad (e.g., BN) on another transceiver on another node. An A2B digital logic module 930 may communicate (e.g., through electronic signals) with a phased locked loop (PLL) 932, which may employ a differential decoder 100 of the present Specification. Also included are a low dropout regulator (LDO) 934 and a line power switch 936 (among other components). Various digital pads (e.g., pins) 938 may carry signals in and out of node 812.

In an example embodiment, such as the AD2410 available from Analog Devices, Inc., the error detection behavior of differential decoder 100 is used to detect a synchronization pattern that is generated with intentional decode errors. For example, a frame marker signal is a Manchester bit stream with intentional errors. The frame sync may be detected as a match of a particular data stream with corresponding errors. This reduces the likely hood of detecting a false frame sync during the rest of the frame, because the pattern is extremely unlikely to be generated at random, even in a signal that has been corrupted by external noise. This allows the example AD2410 to recognize the pattern without using a clock at the transmission frequency or a higher-speed, oversampling clock As used throughout this Specification, the terms listed below are intended to include at least the provided definitions, construed in their broadest possible interpretation:

audio signal—a signal containing information from which a mechanical wave can be constructed.

circuit—any collection, arrangement, or aggregation of electrical or electronic elements, discrete or integrated, whether active or passive, communicatively coupled to one another via any medium and disposed in a useful configuration.

combinatorial logic—any logic network or subnetwork that is not clocked.

composite signal—a signal that is formed or otherwise configured from two or more signals.

decode—to reverse the encoding of an encoded signal.

encode—to translate a signal from a first form to a second form, where translating may comprise conditioning, modulating, phase shifting, combining, encrypting, or otherwise altering the signal in a reversible manner.

encoding—as a noun, a signal that has been encoded. Also a present-tense verb for encode.

infer—to create an inferred signal from an input signal.

inferred signal—a signal that is constructed, derived, implied, driven by, or otherwise a result of an input signal.

logic network or subnetwork—a network or subnetwork providing Boolean elements, logic, or functions, whether clocked or unclocked, including any hardware, software, firmware, or combination thereof performing a Boolean logic function.

network interface—any hardware, software, firmware, or combination thereof configured to permit one circuit to communicate with another circuit.

sequential logic network or subnetwork—any logic network or subnetwork that includes a trigger, whether clocked or unclocked.

signal—any medium carrying information of any kind from one circuit or subnetwork to any other circuit or subnetwork.

signal processor—any circuit configured to receive a signal and to process, condition, translate, decode, detect, or otherwise handle a signal received from another circuit.

subnetwork—a circuit that is subordinate to another circuit, comprising up to the entire circuit it is subordinate to. Designation of a circuit as a subnetwork is for purposes of clarity of discussion only when describing a circuit that is subordinate to another circuit, and is not intended to imply that the subnetwork is not or cannot be a circuit itself. Subnetworks need not be mutually exclusive of one another, and in some embodiments may have elements that are shared within or between different circuits.

trigger—any circuit, clocked or unclocked, configured to operate as a flip-flop of any kind, latch, bistable multivibrator, or otherwise configured to provide sequential logic operations.

Note that the activities discussed above with reference to the FIGURES are applicable to any discrete or integrated circuits that involve PLL logic, including those that are implemented at least partially in software. Certain embodiments can relate to multi-DSP signal processing, floating point processing, signal/control processing, fixed-function processing, microcontroller applications, by way of non-limiting example. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the disclosed PLL can be used in image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, any clocks, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the PLL functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the Specification, to limit this disclosure in any way that is not otherwise reflected in the appended claims.

What is claimed is:

1. A decoder circuit for decoding a composite clock-data signal $m_{in}$ into a data signal data, the decoder circuit comprising:

a parsing circuit configured to parse the composite clock-data signal $m_{in}$ into an intermediate data signal a, a conditioning signal b, and an intermediate clock signal $p_o$, wherein the intermediate data signal a encodes an unclocked version of the data signal data, the parsing circuit comprising
a pulse generator configured to receive the composite clock-data signal $m_{in}$ and to output a pulse $p_i$ on transition edges of the composite clock-data signal $m_{in}$;
a delay circuit having a delay time $t_d$ and configured to receive the pulse $p_i$ and to output the intermediate clock signal $p_o$; and
a flip-flop clocked by the intermediate clock signal $p_o$ and configured to receive the intermediate data signal a and the logical inverse of the conditioning signal b and to output the conditioning signal b; and
a data circuit comprising
a logic subnetwork configured to receive the intermediate data signal a, the conditioning signal b, and the intermediate clock signal $p_o$ and to generate therefrom a clock signal sclk; and
a data subnetwork clocked by the clock signal sclk and configured to generate the data signal data from the intermediate data signal a.

2. The decoder circuit of claim 1, wherein the composite clock-data signal $m_{in}$ is a differential Manchester encoding.

3. The decoder circuit of claim 1, wherein the parsing circuit comprises:
a trigger configured to set a clock pulse signal cke upon receiving the pulse $p_i$ and to reset the clock pulse signal cke upon receiving the intermediate clock signal $p_o$.

4. The decoder circuit of claim 3, wherein:
the composite clock-data signal $m_{in}$ is a clock-first, change-on-zero differential Manchester encoding, wherein a clock transition leads an optional data transition in which a transition represents a zero and no transition represents a one; and
the delay circuit is configured to output the intermediate clock signal $p_o$ after the clock transition of the composite clock-data signal $m_{in}$ but before the optional data transition.

5. The decoder circuit of claim 4, wherein the composite clock-data signal $m_{in}$ has a period $t_{per}$, and the delay time $t_d$ is approximately 70% of the period $t_{per}$.

6. The decoder circuit of claim 1, wherein the data circuit further comprises an error subnetwork configured to receive the intermediate data signal a, the conditioning signal b, and the clock signal sclk, and to generate therefrom an error signal error.

7. The decoder circuit of claim 6, wherein the error subnetwork includes a D flip-flop clocked by the clock signal sclk and that has a data input of the logical AND of the intermediate data signal a and the conditioning signal b.

8. The decoder circuit of claim 1, wherein the flip-flop receives as a data input the value of the logical AND of the intermediate data signal a and the logical inverse of the conditioning signal b, and configured to output the conditioning signal b.

9. A method of decoding a composite dock-data signal $m_{in}$ into a data signal data, the method comprising:
parsing the composite clock-data signal $m_{in}$ into an intermediate data signal a, a conditioning signal b, and an intermediate dock signal $p_o$, wherein the intermediate data signal a encodes an unclocked version of the data signal data;
generating a pulse $p_i$ on transition edges of the composite clock-data signal $m_{in}$;
generating the intermediate clock signal $p_o$ by delaying the pulse $p_i$ by a delay time $t_d$;
receiving the intermediate data signal a and the logical inverse of the conditioning signal b, and outputting the conditioning signal b;

generating from the intermediate data signal a, the conditioning signal b, and the intermediate clock signal $p_o$ a clock signal sclk; and generating the data signal data from the intermediate data signal a, wherein the data signal data is clocked by the clock signal sclk.

10. The method of claim 9, wherein the composite clock-data signal $m_{in}$ is a differential Manchester encoding.

11. The method of claim 9, wherein the parsing the composite clock-data signal $m_{in}$ comprises:

generating a clock pulse signal cke upon receiving the pulse $p_i$ and resetting the clock pulse signal cke upon receiving the intermediate clock signal $p_o$.

12. The method of claim 11, wherein:

the composite clock-data signal $m_{in}$ is a clock first, change-on-zero differential Manchester encoding, wherein a clock transition leads an optional data transition in which a transition represents a zero and no transition represents a one; and the generating the intermediate clock signal $p_o$ comprises outputting the intermediate clock signal $p_o$ after the clock transition of the composite clock-data signal $m_{in}$ but before the optional data transition of the composite clock-data signal $m_{in}$.

13. The method of claim 12, wherein the composite clock-data signal $m_{in}$ has a period $t_{per}$, and the delay time $t_d$ is approximately 70% of the period $t_{per}$.

14. The method of claim 9, further comprising:

generating an error signal error from the intermediate data signal a, the conditioning signal b, and the clock signal sclk.

15. The method of claim 14, wherein the generating the error signal error comprises outputting the value of the logical AND of the intermediate data signal a and the conditioning signal b clocked by the clock signal sclk.

16. The method of claim 9, wherein generating the conditioning signal b comprises outputting the value of the logical AND of the intermediate data signal a and the logical inverse of the conditioning signal b, clocked by the intermediate clock signal $p_o$, wherein the logical inverse of the conditioning signal b is received in a feedback configuration.

17. A signal processor configured to decode a clock-before-data, change-on-zero differential Manchester-encoded signal $m_{in}$, the signal processor comprising:

a network interface for receiving the signal $m_{in}$;

a parser configured to infer from the signal $m_{in}$ a first inferred signal, a second inferred signal, and a third inferred signal;

a pulse generator configured to receive the signal $m_{in}$ and to output a signal;

a delay element configured to receive the output signal of the pulse generator and to output the third inferred signal;

a first trigger clocked by the third inferred signal and configured to output the second inferred signal, based on the first inferred signal and the logical inverse of the second inferred signal; and a data encoder configured to infer and output a data signal inferred from the first inferred signal, wherein the first inferred signal encodes an unclocked version of the data signal, and the output data signal is clocked by a clock signal inferred from the first, second, and third inferred signals.

18. The signal processor of claim 17, wherein the signal $m_{in}$ is an audio signal.

19. The signal processor of claim 17, wherein:

the parser comprises:

a second trigger clocked by the output signal of the pulse generator and configured to provide an output signal that is set on each period of the signal $m_{in}$ and reset by a first composite signal;

a third trigger configured to receive the output signal of the second trigger as an input and to provide as an output the first inferred signal, clocked by the output signal of the pulse generator;

the first trigger is configured to receive as an input the logical AND of the first inferred signal and the logical inverse of a fed-back second inferred signal, the data encoder comprises:

a fourth trigger that receives as an input the logical inverse of the first inferred signal and configured to output the data signal, clocked by the clock signal; and the clock signal is the logical AND of the third inferred signal and a second composite signal, the second composite signal being the logical OR of the logical inverse of the second inferred signal and a third composite signal, the third composite signal being the logical AND of the first inferred signal and the second inferred signal.

20. The signal processor of claim 19, further comprising:

an error generator comprising a fifth trigger that receives as an input the third composite signal, and outputs an error signal clocked by the clock signal.

21. The signal processor of claim 17, further comprising:

an error detector configured to infer an error signal from the first and second inferred signals, wherein the error signal is clocked by the clock signal.

22. The decoder circuit of claim 1, wherein the clock signal sclk is logically equivalent to the logical AND of the intermediate clock signal $p_o$ and a first composite signal, the first composite signal being the logical OR of the logical inverse of the conditioning signal b and a second composite signal, the second composite signal being the logical AND of the intermediate data signal a and the conditioning signal b.

* * * * *